United States Patent [19]
Gipstein et al.
[11] 3,916,036
[45] Oct. 28, 1975

[54] SENSITIZED DECOMPOSITION OF POLYSULFONE RESISTS

[75] Inventors: Edward Gipstein, Saratoga, Calif.; Wayne M. Moreau, Wappingers Falls, N.Y.; Omar U. Need, III, San Jose, Calif.

[73] Assignee: International Business Machines Corporation, Armonk, N.Y.

[22] Filed: Sept. 26, 1974

[21] Appl. No.: 509,595

[52] U.S. Cl. .................... 427/43; 96/35.1; 96/36.2; 96/115 P; 204/159.22; 427/273
[51] Int. Cl.$^2$ .......................................... B05D 3/06
[58] Field of Search ...... 427/43, 273; 96/35.1, 36.2, 96/115 P; 204/159.14, 159.19, 159.22

[56] References Cited

UNITED STATES PATENTS

| | | | |
|---|---|---|---|
| 3,661,582 | 5/1972 | Broyde | 96/36.2 |
| 3,820,993 | 6/1974 | Lewis et al. | 96/36.2 |

OTHER PUBLICATIONS

Thompson et al., "J. Electrochem. Soc." Vol. 120, No. 12, Dec. 1973, pp. 1722–1726.

*Primary Examiner*—J. H. Newsome
*Attorney, Agent, or Firm*—Joseph G. Walsh

[57] ABSTRACT

Polysulfone resists are made more sensitive to decomposition by electron beam radiation and also made sensitive to radiation of light in the 3,000 to 5,000 A region by the addition of sensitizers which are either energy transfer agents or sources of free radicals.

5 Claims, No Drawings

SENSITIZED DECOMPOSITION OF POLYSULFONE RESISTS

FIELD OF THE INVENTION

The present invention is concerned with sensitive polysulfone resists. In particular it is concerned with such resists to which an energy transfer agent or a source of free radicals has been added to make the material more sensitive to electron beam radiation and also sensitive to light.

PRIOR ART

The use of polysulfones as electron beam resists is known to the prior art. The process of the present invention, however, increases the sensitivity of such resists to electron beam radiation and also renders such resists sensitive to light in the 3,000 to 5,000 A region.

SUMMARY OF THE INVENTION

According to the present invention, the polysulfone resists of the prior art are sensitized by the addition of either an energy transfer agent or a free radical source or most preferably both types of sensitizers. It has now unexpectedly been found that the addition of such materials increases the sensitivity of the polysulfone resist to radiation with electron beams and also serves to make the resist useful as a photoresist for lithographic production of semiconductor circuits by contact or projection printing.

It should particularly be emphasized by the use of the present invention that polysulfone resists have been obtained which can be used with E-beam radiation in dosage as low as $10^{-7}$ coulombs/$cm^2$.

The materials found particularly useful as energy transfer agents in the present invention include azulene, 2,4,7-trinitrofluorenone, fluorene, diphenylamine and p-nitroaniline. Many sources of free radicals are also well known in the art. Particularly useful results have been obtained, for example, using carbon tetrachloride, carbon tetrabromide, carbon tetraiodide, phenyl disulfide, azobenzene and poly (α-chloromethylacrylate).

In the process of the present invention, a layer of sensitized polymer is applied to a substrate and the portions of the layer to be removed are exposed to an electron beam or other radiation which acts to reduce the molecular weight of the polymer in the energy struck areas. The polymer in the energy struck areas is then selectively removed with a solvent developer solution which preferably dissolves the lower molecular weight material leaving a patterned protective layer of polymer covering the unexposed areas. Such processes are especially suitable for use in the manufacture of high density microcircuits because of the high resolution obtainable by the use of electron beam exposure.

Suitable solvents should have boiling points which are below the decomposition point of the polymer to permit removal of the solvent from the cast film by heating. Examples of suitable solvents are organic liquids such as, for example, toluene, cyclohexanone, benzene, chlorobenzene, butyl acetate, ethylacetate, chloroform, acetone, dioxane, xylene, methyl ethyl ketone, methyl isobutyl ketone and dimethyl sulfoxide.

The films can be cast in various thicknesses of from about 50 A to about 10 microns as is conventional in the art depending upon the intended use of the resist image. For example, about 0.5 to about 2.0 microns for an etch process or from about 1.5 to about 3 microns for a lift-off metallurgy process. The casting process is conventional such as by spinning or dip cast.

It is preferred to prebake the resist film in air or vacuum at a temperature usually above the glass transition temperature of the polymer but below the thermal decomposition temperature. The prebake removes traces of solvent and anneals out any strains in the film. Suitable baking temperatures range from about 25°C to a few degrees below the polymer decomposition temperature.

The resist is exposed patternwise to radiation such as, for example, ultraviolet, visible light, electron beam, X-ray, and gamma radiation which acts to rapidly degrade the polymer. The sensitivity of the polymers make them particularly useful for a process employing low energy electron beam radiation of from about 10 to about 30 KeV with charge densities of from about $1 \times 10^{-7}$ coul/$cm^2$ to about 1 coul/$cm^2$ as is known in the art. The dosage required can be reduced by heating the polymer during exposure.

The ultimate products of the decomposition of the polymer are the monomers i.e. sulfur dioxide and olefin. In one aspect of the invention, the image is solvent developed using solvents which preferentially dissolve the lower molecular weight degraded polymer in the exposed portions of the film. Suitable solvents include, for example, toluene, methyl isobutyl ketone, butyl acetate, xylene, cyclohexanone, cellosolve acetate, benzene and chlorobenzene. The development rate can be adjusted by heating or cooling the solvent.

The solvent development is carried out preferably in the temperature range of from about 10°C to about 50°C. Three types of development processes can be used. In the first a good solvent for both the exposed and unexposed polymer is used to gain speed with the resist thickness adjusted so that the remaining unexposed resist film is thick enough to protect the substrate during the subsequent treatment. Alternatively, a solvent for the exposed areas only is employed. In the third type of development a mixture of a solvent for both the exposed and unexposed polymer and a solvent for the exposed polymer only is used. The optimum development time is determined for each case by the factors of exposure dosage, film thickness, solvent system and solvent temperature as known by one skilled in the art.

The patterned resist image requires no postbake and has high resolutions of less than the film thickness; for example, 0.50 micron line and space images in a film thickness of 1.0 micron.

The resist films can be solvent stripped from the substrate following the etch process. Suitable stripping solvents are solvents such as, for example, aliphatic and aromatic hydrocarbons, ketones, and acetates which are heated from about 21°C to 100°C. One solvent can serve in the process as the casting solvent, the developer, and the stripper by adjusting the processing temperature. For example, nitromethane can be used at room temperature to apply and develop the resist and toluene can be used at 50°C to strip the resist.

The following examples are given solely for purposes of illustration and are not to be considered limitations on the invention, many variations of which are possible without departing from the spirit or scope thereof.

EXAMPLE 1

Three percent solutions of the polysulfone and free radical or triplet sensitizers in nitromethane were prepared and spin coated on $SiO_2/Si$ wafers at 2,000 rpm. The wafers were placed in a vacuum oven at 65°C for 12 hr. to dry and to remove the solvent. The wafers were then exposed with a 150 watt ultraviolet lamp for 1 hr. through a mask using a pyrex filter to cut off all light below 3,300 A. The lamp distance from the wafer was 5 inches. Polysulfone controls (without additives) were also prepared and exposed 3 hours. The images were developed with 1,4-dichlorobutane solvent. The time of development varied from sample to sample; the image considered developed when the subsurface of the silicon wafer could be observed. The following results were obtained:

| Additive | Type of Image | Quality of Image |
|---|---|---|
| $CBr_4$ | + | Excellent |
| Azulene | + | Good |
| 2,4,7-TNF | + | Good |
| Fluorene | + | Good |
| Diphenylamine | + | Good |
| p-nitroaniline | + | Good |
| Azobenzene | + | Good |
| Control (polycyclopentene sulfone) | No image developed after exposure for three (3) hrs. | |

EXAMPLE 2

To simulate the E-beam exposure conditions, the following samples were exposed to direct ultraviolet light (2,200–5,000A).

| Additive | Type of Image | Quality of Image |
|---|---|---|
| $CBr_4$ | + | Excellent (developed in 10 sec.) |
| $CI_4$ | + | Good |
| Control (polycyclopentenesulfone) | + | Excellent (developed in 1000 sec.) |

EXAMPLE 3

Five percent solutions of poly(hexene-1-sulfone) in carbon tetrachloride ($CCl_4$) and nitromethane ($CH_3NO_2$) were degassed through three freeze-thaw cycles on a high vacuum line. The Schlenk tubes were sealed under vacuum and then exposed to 5 M rads δ-radiation. The molecular weights of the exposed polymers in these solvents are compared with the molecular weights of the unexposed control polymers.

| | | | Mv/Mv' |
|---|---|---|---|
| Mv (unexposed control) | | 428,200 | 29 |
| Mv' (5% in $CCl_4$) | 5 Mrad Dose | 14,900 | |
| Mv (unexposed control | | 182,910 | 5 |
| Mv' (5% in $CH_3NO_2$) | 5 Mrad Dose | 36,540 | |

These molecular weight-degradation studies indicate that halogenated free radical sources ($CCl_4$) greatly enhance the radiative degradation of polysulfones.

As a result of the enhanced sensitivity of these polysulfones to visible light (3,000 to 6,000 A), photodegradable products can be formulated i.e. films for food packaging, printed materials, agricultural products, etc.

EXAMPLE 4

The affect of the addition of carbon tetrabromide on poly (cyclopentene) sulfone has been investigated. When 5 percent by weight carbon tetrabromide is added the sensitivity of the resist to electron beam radiation is increased by a factor of approximately 5 to 10. Similar results were also obtained when, instead of carbon tetrabromide, 5 percent by weight of poly (α-chloromethacrylate) was added.

What is claimed is:

1. A process for forming an image with a high resolution radiation sensitive positive resist comprising the steps of:

1. forming on a substrate a film comprising a polysulfone sensitized by the addition of a charge transfer agent or a chemical source of free radicals,
2. exposing said film in a predetermined pattern under radiation, and
3. removing the radiation exposed portion of said film with a solvent.

2. A process as claimed in claim 1 wherein the radiation is low energy electron beam radiation of from about 10 to about 30 KeV.

3. A process as claimed in claim 1 wherein the radiation is light having several lengths of from 3,000 to 5,000 A.

4. A process as claimed in claim 1 wherein the energy transfer agent is a material selected from the group consisting of azulene, 2,4,7-trinitrofluorenone, fluorene, diphenylamine and p-nitroaniline.

5. A process as claimed in claim 1 wherein the free radical source is a material selected from the group consisting of carbon tetrachloride, carbon tetrabromide, carbon tetraiodide, phenyl disulfide, azobenzene and poly (α-chloromethylacrylate).

* * * * *